PULSE GENERATOR EMPLOYING CASCADE CONNECTED TRANSISTORS FOR SWITCHING DIRECT CURRENT POWER SOURCES ACROSS OUTPUT TRANSFORMERS
Filed March 11, 1960
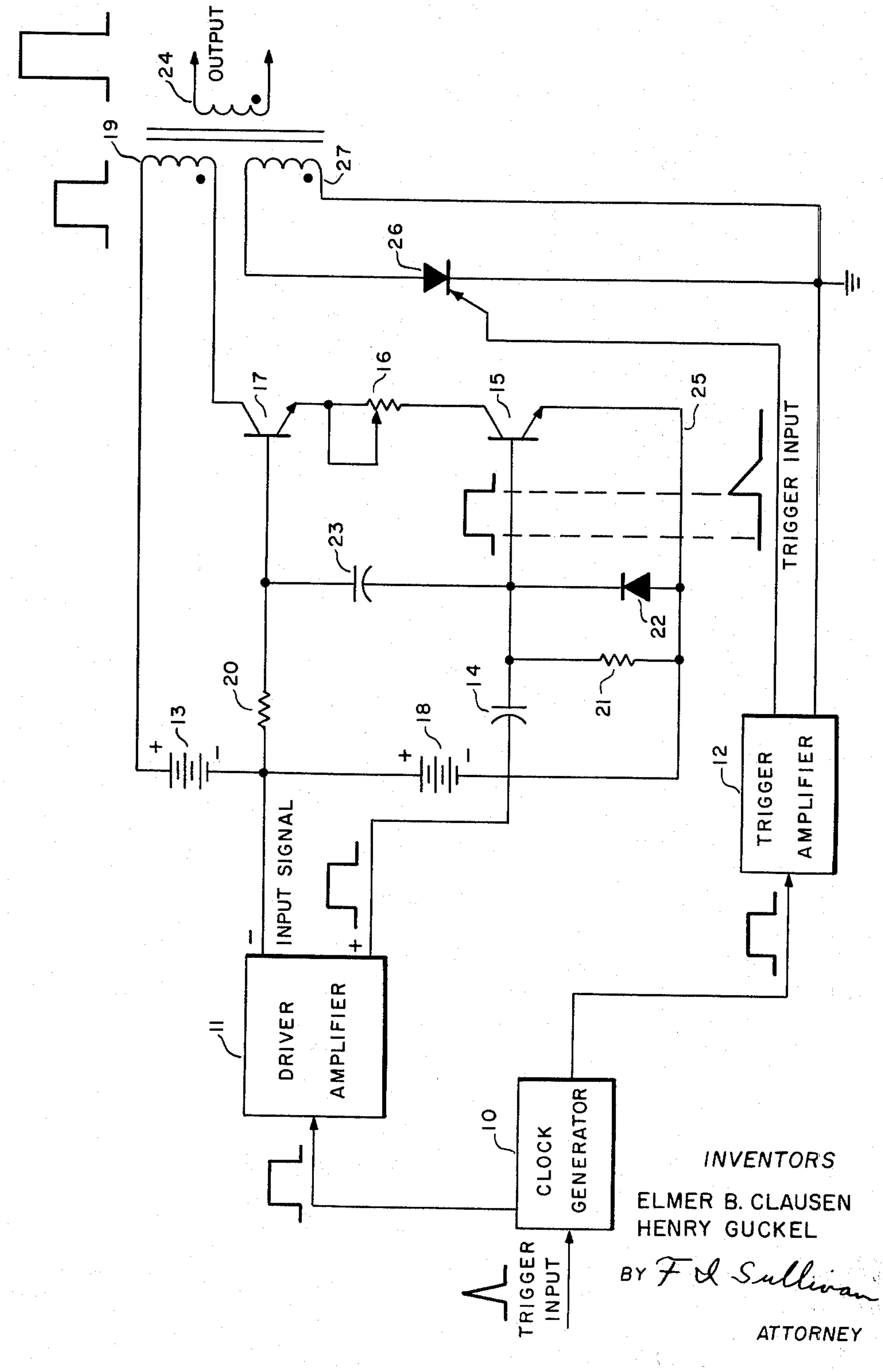
INVENTORS
ELMER B. CLAUSEN
HENRY GUCKEL
BY F. J. Sullivan
ATTORNEY 3,168,648
Patented Feb. 2, 1965

3,168,648

PULSE GENERATOR EMPLOYING CASCADE CONNECTED TRANSISTORS FOR SWITCHING DIRECT CURRENT POWER SOURCES ACROSS OUTPUT TRANSFORMERS

Elmer B. Clausen, Snyder, N.Y., and Henry Guckel, Urbana, Ill., assignors to Sylvania Electric Products Inc., a corporation of Delaware Filed Mar. 11, 1960, Ser. No. 14,289
1 Claim. (Cl. 307—88.5)

This invention relates to electronic circuits and particularly to switching circuits capable of producing high speed square wave output pulses of high voltage and current in response to the application of a low power triggering pulse.

In some practical applications of pulse circuitry, relatively high energy pulses of microsecond duration and extremely fast rise and fall times are required. A typical example is pulsing the control grid of a traveling wave tube. Here, pulses in the range of 300 to 500 volts drawing quarter and half ampere currents are frequently required.

Heretofore, it has been the practice in the design of square wave switching circuits for this and similar purposes to use transistor methods which were subject to limited voltage output due to inherent breakdown characteristics. Vacuum tubes have also been used; however, aside from obvious space disadvantages, their output current is limited and low output impedance is unobtainable during the fall time of the pulse and immediately after pulse occurrence.

Accordingly, a primary object of the present invention is to provide a transistor switching circuit capable of producing high speed square wave output pulses of high voltage and current in response to the application of a low power triggering pulse.

Other objects of the invention are to provide: an electronic switching circuit to produce high power square wave pulses with low output impedance; a simplified electronic switching circuit to produce high power square wave pulses with a minimum space requirement; an electronic switching circuit to produce high power square wave pulses with an adjustable voltage output; an electronic switching circuit to produce high power square wave pulses with low input power requirements; and, an improved high energy pulse circuit.

These and related objects are accomplished in one practical embodiment of the invention by providing a pulse generator including: a clock; a driver amplifier; a trigger amplifier; and, a specialized transistor switching circuit.

The clock supplies square shaped pulses to both the driver amplifier and the trigger amplifier and the driver amplifier supplies a relatively low voltage, high current square wave signal input to the transistor switching circuit. This circuit includes a variable resistor, a pair of transistors and a pair of direct current supplies serially connected across the primary of a pulse transformer. The circuit is arranged such that one transistor is direct current driven and the other is pulse driven. During the "off" state, the direct current driven transistor is biased by leakage currents from collector to emitter to maintain stability. Also, the total direct current supply voltage appears across the transistor chain so that the breakdown voltage of each transistor is not exceeded. In order to obtain an output pulse across the secondary of the transformer, the relatively high current square wave signal is applied to the base of the pulse driven transistor to turn it on quickly. This allows forward biasing of the direct current driven transistor so that a reference potential for the applied current source is effectively connected to the transistor side of the transformer. As a result, almost the total direct current supply voltage drop occurs across the transformer primary. After pulse occurrence, the pulse driven base is returned to the reverse bias direction and both transistors turn off. The output voltage level is controlled by the variable resistor.

Other objects and features of the invention will be apparent from the following description, reference being had to the accompanying drawing, the single figure of which is a schematic circuit diagram of a pulse generator embodying the invention.

Referring to the drawing, the invention is illustrated as embodied in a pulse generator including: a clock 10 having its output connected to both a driver amplifier 11 and a trigger amplifier 12. The clock may be a triggered monostable flip-flop with a pulse width control. The driver amplifier may be transformer coupled to the clock generator for isolation and consist of successive emitter follower stages to provide power gain with low output impedance; and, the trigger amplifier may be a differentiator delay in combination with cascaded emitter followers to provide gain and control output impedance.

The driver amplifier 11 supplies the input signal to the specialized transistor switching circuit by means of a negative output terminal which is connected to the negative side of a direct current supply 13 and a positive output terminal which is connected, through a coupling capacitor 14, to the base of a transistor 15. Hence, transistor 15 is pulse driven. The transistor switch also includes a variable resistor 16, an additional transistor 17, and another direct current supply 18. Supplies 13 and 18 are serially connected across the primary winding 19 of the output pulse transformer.

The collector of transistor 17 is connected through primary 19 to the positive terminal of the direct current supply 13. The negative terminal of supply 13 is, in turn, connected to the positive terminal of supply 18 and, through bias control resistor 20, to the base of transistor 17. Hence, transistor 17 is direct current driven. The negative terminal of supply 18 is connected to the emitter of transistor 15 and, through bias resistor 21, to the base of transistor 15. The collector of this transistor 15 is connected, through variable resistor 16, to the emitter of transistor 17. If desired, this variable resistor may be connected between primary 19 and the collector of transistor 17 to provide more amplitude on the output voltage. Diode 22 is connected between the emitter and base of transistor 15 to bypass negative current around the base-emitter junction. Capacitor 23 is connected between the bases of transistors 15 and 17 to improve pulse rise time. The pulse generator output appears across the secondary winding 24 of the pulse transformer.

The trigger amplifier 12 supplies a trigger pulse to a pulse trailing edge clamp circuit by means of connection 25 to the gate of gated diode 26. The pulse trailing edge clamp consists of the gated diode 26 connected across a tertiary winding 27 of the pulse transformer. One terminal of trigger amplifier 12, the cathode of gated diode 26 and one terminal of tertiary winding 27 are all connected to a common ground.

In operation, clock generator 10 supplies square shaped pulses to both driver amplifier 11 and trigger amplifier 12. The basic function of driver amplifier 11 is to provide sufficient power gain to produce a low voltage, high current square wave pulse to enable hard driving of the transistor switching circuit and to present a low source impedance to its input. The basic function of trigger amplifier 12 is to produce a trigger pulse of sufficient energy to trigger gated diode 26 at the trailing edge of the pulse from clock 10.

When the transistor switching circuit is in "off" condition, transistor 17 is biased by leakage current flow from emitter to collector to maintain stability. The collector of transistor 17 is at the positive potential of supply 13. The emitter of transistor 17 and the collector of transistor 15 are at approximately zero potential and the emitter of transistor 15 is at the minus potential of supply 18. Hence, the total direct current supply voltage appears across the transistor chain and yet the breakdown voltage of each transistor is not exceeded.

In order to obtain an output pulse across secondary winding 24 of the output transformer, the relatively high current square wave from driver amplifier 11 is applied to the base of transistor 15 with a resultant fast "turn-on." This causes forward biasing of transistor 17 so that the negative side of power source 18 is effectively applied to the terminal of primary winding 19 connected to the collector of transistor 17. With the circuit in this "on" condition, the collector of transistor 15 is at the minus potential of supply 18 less the voltage drop across its collector-emitter junction and the collector of transistor 17 is at the minus potential of supply 18 less the voltage drops across transistors 15 and 17 and variable resistor 16. Consequently, the total series voltage supplies 13 and 18 less the voltage drops across the transistors and the variable resistor is applied across primary winding 19. Of course, the output voltage level may be adjusted by variable resistor 16. After pulse occurrence, the base of transistor 15 is returned to the reverse bias condition and transistors 15 and 17 turn off. An important feature of the circuit is that the only relation of the output to the input of the transistor combination is a switching function.

By way of example the following circuit parameters may be used in the embodiment of the transistor switch shown in the drawing:

| | |
|---|---|
| Input signal | 16 volts at 91 ohm level. |
| Direct current supply 13 | 150 volts. |
| Direct current supply 18 | 150 volts. |
| Resistor 20 | 330 ohms 1 watt. |
| Resistor 21 | 100 ohms ½ watt. |
| Variable resistor 16 | 200 ohms 10 watts. |
| Capacitor 14 | 1 microfarad 200 v. D.C. |
| Capacitor 23 | 1000 micromicrofarads. |
| Diode 22 | 1N649 type. |
| Transistor 15 | 2N424 type. |
| Transistor 17 | 2N424 type. |

A circuit constructed with these suggested components has produced output pulses of almost 300 volts and 1.2 amps. across the primary winding 19 of the output pulse transformer. Hard driving enabled obtaining rise times of less than 0.5 microsecond. The circuit has operated with a prf of firing up to 20 kc. and duration limited only by the dissipation rating of the transistors. The output impedance was 24 ohms across the primary winding 19 of the transformer plus the series impedance of variable resistor 16.

An input square wave signal with a width in the microsecond range and a rise time of 0.1 microsecond was used. Voltage levels with respect to ground during the "off" state were approximately 0 at the collector of transistor 15 and +150 v. at the collector of transistor 17. Voltage levels with respect to ground during "on" state were −145 v. at the collector of transistor 15 and −140 v. at the collector of transistor 17 with variable resistor 16 set at zero.

Normally, the output pulse from a transistor switch would exhibit a delay in fall time due to storage effects of the transistors resulting from hard driving to obtain fast rise times. To control this fall time and also to assure a low output impedance from the pulse generator during pulse fall time and immediately following pulse occurrence, a pulse trailing edge clamp circuit is used.

A trigger pulse from the trigger amplifier 12 is applied to the gate of gated diode 26 to actuate this clamping circuit. This input trigger may be derived from the differentiated trailing edge of the square wave clock pulse, thereby coinciding with the trailing edge of the transistor switch "on" pulse. Thus, when the transistor 15 base signal goes to the "off" state, the diode 26 fires as a result of the trigger pulse applied through connection 25. As soon as the diode 26 is fired to conduct, the normally open-ended tertiary winding 27 of the transformer to which the transistor switch is connected is shunted by less than one ohm impedance, thereby producing an effective short circuit. Hence, any storage effects in the transistor switch due to hard driving are quickly clamped out and the pulse transformer output impedance is reduced to approximately zero. Diode 26 continues to conduct and the transformer output remains at close to zero impedance until all energy sources are essentially either removed or depleted. As a result, the fall time of the pulse across secondary winding 24 is determined by trigger location and the output impedance is at approximately zero during fall time and immediately following pulse occurrence.

In the illustrative embodiment of the invention under description, a ZJ39–200 type was used for gated diode 26 and high speed "tail biting" action was achieved.

To summarize, high speed square wave output pulses of high voltage and current and low source impedance are obtained from a pulse generator using a unique transistor switching circuit and pulse trailing edge clamp. The transistor switch includes a pair of series connected transistors, corresponding direct supplies, and an output transformer. During "off" time the total supply voltage lies across the transistor chain so that the breakdown voltage of an individual transistor is not exceeded. The pulse trailing edge clamp comprises a gated diode connected across a tertiary winding on the transformer to which the transistor switch is connected. The diode is arranged to be rendered conducting in coincidence with the trailing edge of the "on" pulse applied to the transistor switch, effective to generate a short circuit across the transformer to produce short fall times and lower the source of impedance during fall time and immediately following pulse occurrence. As a result, overdrive of the transistor switch to obtain faster rise times is permissible.

Although the transistor switch has been described and illustrated as using NPN type transistors, the circuit may be modified, by reversing the supply connections, to use transistors of the PNP type. Moreover the invention is not limited to the specific illustrative embodiment shown and described but includes the full scope of the following claim.

What is claimed is:

An electronic pulse generator comprising, in combination, an output pulse transformer having at least one secondary and one primary winding, at least first and second transistors each having collector, emitter, and base electrodes, said transistors being serially connected, with the emitter of the first connected through a variable impedance element to the collector of the second transistor, and the collector of said first transistor connected to one terminal of said primary winding, first and second substantially equal potential sources of direct current power serially connected between the other terminal of said pri- lector terminal of said first transistor and the emitter terminal of said second transistor whereby the potential mary winding and the emitter electrode of said second transistor, a first bias control resistor connected between the base electrode of said first transistor and the junction of said first and second sources of direct current power, a second bias control resistor connected between the emitter and base electrodes of said second transistor, a source of input signal pulses connected to the base electrode of said second transistor, said pulse generator being operative in response to an input signal pulse to apply a potential substantially equal to the sum of the potentials of said first and second power sources across said primary winding and in the absence of an input signal pulse to apply a potential substantially equal to the sum of the potentials of said first and second power sources across the col- at the emitter of said first transistor and the collector of said second transistor approximates zero, and a capacitor connected between the base electrode of said second transistor and the base electrode of said first transistor.

References Cited in the file of this patent

UNITED STATES PATENTS

| | | |
|---|---|---|
| 2,590,836 | Andrew | Apr. 1, 1952 |
| 2,726,331 | Robinson | Dec. 6, 1955 |
| 2,835,829 | Sourgens et al. | May 20, 1958 |
| 2,857,518 | Reed | Oct. 21, 1958 |
| 2,933,692 | Meyers | Apr. 19, 1960 |
| 2,941,119 | Ford | June 14, 1960 |
| 2,953,754 | Roesel | Sept. 20, 1960 |
| 2,981,895 | Koch | Apr. 25, 1961 |
| 3,030,566 | Collins | Apr. 17, 1962 |

UNITED STATES PATENT OFFICE
CERTIFICATE OF CORRECTION

Patent No. 3,168,648 February 2, 1965

Elmer B. Clausen et al.

It is hereby certified that error appears in the above numbered patent requiring correction and that the said Letters Patent should read as corrected below.

Column 4, line 44, after "direct" insert -- current --; column 5, lines 2 and 3, strike out "lector terminal of said first transistor and the emitter terminal of said second transistor whereby the potential" and insert the same after "col-" in line 17, same column 5.

Signed and sealed this 6th day of July 1965.

(SEAL)
Attest:

ERNEST W. SWIDER
Attesting Officer

EDWARD J. BRENNER
Commissioner of Patents